United States Patent
Siebens

(10) Patent No.: US 8,368,405 B2
(45) Date of Patent: Feb. 5, 2013

(54) REMOTE TEST POINT FOR ELECTRICAL CONNECTOR

(75) Inventor: Larry N. Siebens, Asbury, NJ (US)

(73) Assignee: Thomas & Betts International, Inc., Wilmington, DE (US)

( * ) Notice: Subject to any disclaimer, the term of this patent is extended or adjusted under 35 U.S.C. 154(b) by 379 days.

(21) Appl. No.: 12/840,458

(22) Filed: Jul. 21, 2010

(65) Prior Publication Data

US 2011/0025342 A1 Feb. 3, 2011

Related U.S. Application Data

(60) Provisional application No. 61/229,844, filed on Jul. 30, 2009.

(51) Int. Cl.
*G01R 31/04* (2006.01)
*H01R 13/58* (2006.01)

(52) U.S. Cl. ........................ 324/538; 439/912

(58) Field of Classification Search ............. 324/538, 324/537, 500; 439/604, 606, 921, 912
See application file for complete search history.

(56) References Cited

U.S. PATENT DOCUMENTS

| | | | |
|---|---|---|---|
| 3,390,331 A | 6/1968 | Brown et al. | |
| 3,991,367 A | 11/1976 | Chapman et al. | |
| 4,152,643 A | 5/1979 | Schweitzer, Jr. | |
| 4,263,550 A | 4/1981 | Schweitzer, Jr. | |
| 4,458,198 A | 7/1984 | Schweitzer, Jr. | |
| 4,760,327 A | 7/1988 | Walsh et al. | |
| 4,904,932 A | 2/1990 | Schweitzer, Jr. | |
| 5,082,449 A * | 1/1992 | Borgstrom et al. | 439/88 |
| 5,159,319 A | 10/1992 | Dunk et al. | |
| 5,420,502 A | 5/1995 | Schweitzer, Jr. | |
| 5,421,750 A | 6/1995 | Crotty | |
| 5,475,371 A | 12/1995 | Dunk et al. | |
| 6,133,723 A | 10/2000 | Feight | |
| 6,313,635 B1 | 11/2001 | Noll | |
| 6,475,032 B1 * | 11/2002 | Dvorak | 439/606 |
| 6,479,981 B2 | 11/2002 | Schweitzer, Jr. et al. | |
| 6,677,741 B2 | 1/2004 | Taylor | |
| 6,843,685 B1 * | 1/2005 | Borgstrom et al. | 439/606 |
| 6,905,356 B2 * | 6/2005 | Jazowski et al. | 439/181 |
| 7,044,760 B2 * | 5/2006 | Borgstrom et al. | 439/187 |
| 7,104,822 B2 * | 9/2006 | Jazowski et al. | 439/181 |
| 7,150,098 B2 * | 12/2006 | Borgstrom et al. | 29/874 |
| 7,168,983 B2 * | 1/2007 | Graf et al. | 439/606 |
| 7,288,718 B2 * | 10/2007 | Stepniak et al. | 174/74 R |
| 7,351,082 B2 * | 4/2008 | Jazowski et al. | 439/181 |
| 7,382,272 B2 | 6/2008 | Feight | |
| 7,445,488 B2 * | 11/2008 | Feldmeier et al. | 439/394 |
| 7,601,022 B2 * | 10/2009 | Huang | 439/491 |
| 7,695,291 B2 * | 4/2010 | Hughes et al. | 439/88 |
| 8,152,547 B2 * | 4/2012 | Hughes | 439/282 |

* cited by examiner

*Primary Examiner* — Hoai-An D Nguyen
(74) *Attorney, Agent, or Firm* — Snyder, Clark, Lesch & Chung, LLP

(57) ABSTRACT

A voltage indicating assembly for medium and high voltage systems includes a semiconductive cap configured for mounting on a test point, the test point including a test point terminal element configured to capacitively receive a voltage associated with a electrical component, where the electrical component is mounted in a first location. The semiconductive cap includes a contact element mounted therein configured to electrically communicate with the test point terminal element when the semiconductive cap is mounted on the test point. A cable is electrically coupled to the contact element. A remote test point assembly is electrically coupled to the cable in a second location remote from the first location, and the remote test point assembly includes a remote test point terminal element.

20 Claims, 5 Drawing Sheets

REMOTE TEST POINT FOR ELECTRICAL CONNECTOR

CROSS-REFERENCE TO RELATED APPLICATION

This application claims priority under 35. U.S.C. §119, based on U.S. Provisional Patent Application No. 61/229,844 filed Jul. 30, 2009, the disclosure of which is hereby incorporated by reference herein.

BACKGROUND OF THE INVENTION

The present invention relates to electrical cable connectors, such as loadbreak connectors and deadbreak connectors. More particularly, aspects described herein relate to an electrical cable connector, such as a power cable elbow or tee connector, having a voltage detection point provided thereon.

Deadbreak cable connectors used in conjunction with 15, 25, and 35 Kilovolt (kV) switchgear generally include a power cable elbow connector having one end adapted for receiving a power cable and another end adapted for receiving a deadbreak bushing. The end adapted for receiving the bushing insert generally includes an elbow cuff for providing an interference fit with a molded flange on the bushing. This interference fit between the elbow cuff and the bushing insert provides a moisture and dust seal therebetween.

Deadbreak elbows typically comprise a conductor surrounded by a semiconducting layer and an insulating layer, all encased in a semiconductive outer shield. The elbow connector may further include a test point terminal embedded in the insulating sheath and exposed for contact from outside of the shield. A voltage on the conductor capacitively couples a first voltage on the test point terminal and a second voltage on the outer shield.

Service personnel commonly encounter difficulty in reliably determining whether a voltage is present on a deadbreak elbow. This is of considerable importance, since the safety of service personnel effecting service on such a system may depend upon the reliability of a status indicator correctly indicating the status of the connector to prevent electrical shock hazards.

A variety of indicating devices for such purpose are known. These devices must be carefully employed in order to avoid electrical shock and draw a current from the conductor being tested which can affect the voltage reading. Failure of the device could indicate a false voltage status which may lead service personnel to assume that there is no voltage on the conductor when a voltage is in fact present, which presents an obvious safety hazard. Electrical shock hazards can also arise when the test point terminal and the area surrounding the terminal are not carefully manufactured or are subject to debris and contaminants.

Electrical connectors generally operate by connecting ground and power terminals of respective connector elements together in a manner that facilitates electrical continuity between the respective elements. In some embodiments, for example, a male connector may be inserted into a corresponding female connector to effect the connection.

In high voltage environments, additional factors may arise, such as the possibility of arcing or flashover between conducting elements of an electrical connector during connection of disconnection of the connector. These flashover or arcing events may cause injury to users, may ignite flammable or combustible gases in the ambient environment, or may damage equipment.

DETAILED DESCRIPTION OF THE PREFERRED EMBODIMENTS

The following detailed description refers to the accompanying drawings. The same reference numbers in different drawings may identify the same or similar elements.

Figure 1:
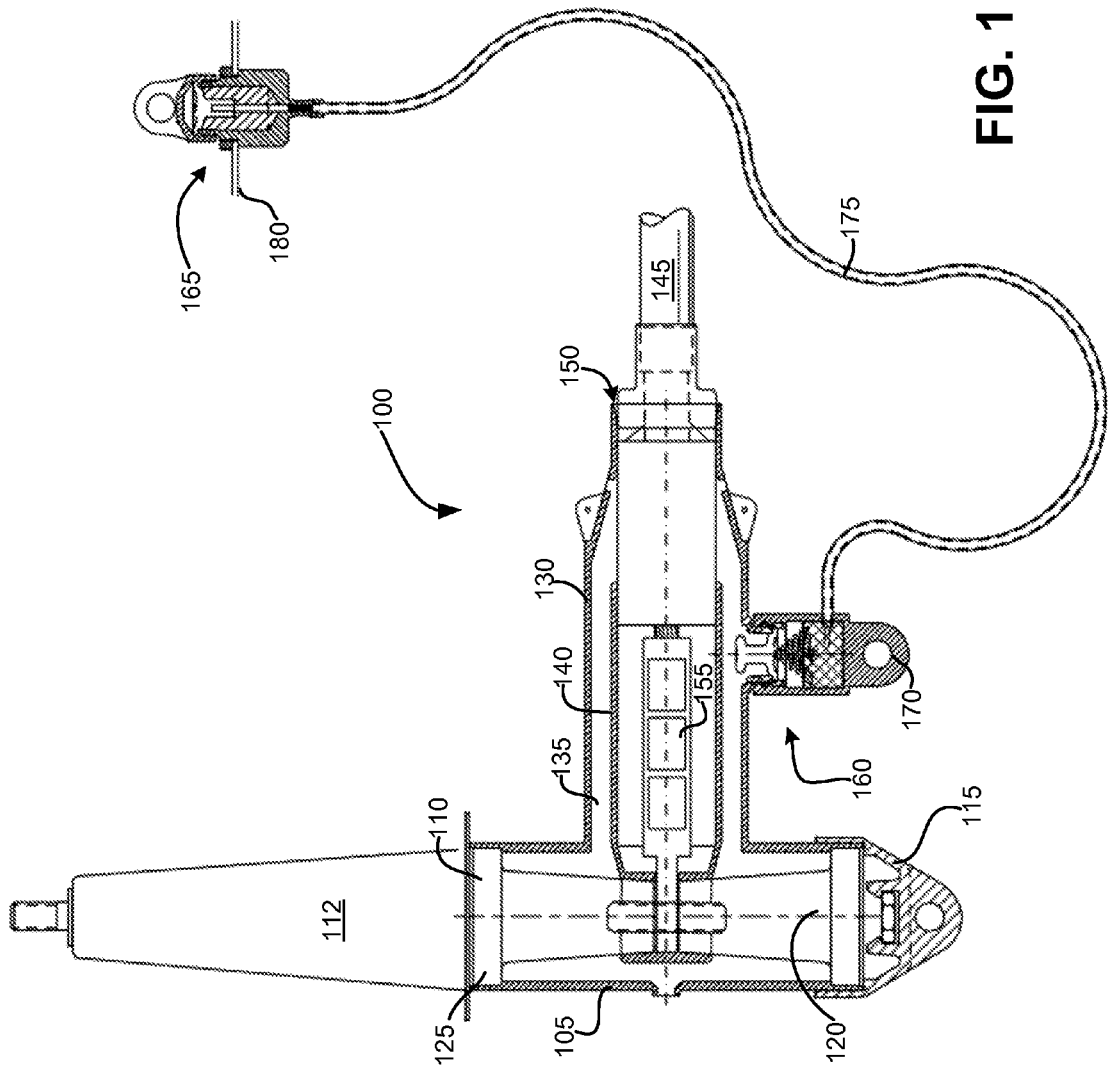
FIG. 1 is a schematic cross-sectional diagram illustrating an electrical connector having a remote test point assembly consistent with implementations described herein.

FIG. 1 is a schematic cross-sectional diagram illustrating an electrical connector 100 having a remote test point assembly 165. As shown in FIG. 1, connector 100 may include a power cable elbow connector 105 that may be coupled to a deadbreak bushing or other similar equipment at a first tee opening 110. In addition, power elbow connector 105 may be coupled to, for example, an insulating plug 115 or other power equipment at a second tee opening 120. Each of first tee opening 110 and second tee opening 120 may include a flange or elbow cuff 125 surrounding the open receiving end thereof.

Power cable elbow connector 105 may include an electrically conductive outer shield 130 formed from, for example, a conductive peroxide-cured synthetic rubber, commonly referred to as EPDM (ethylene-propylene-dienemonomer). Within shield 130, power cable elbow connector 105 may include an insulative inner housing 135, typically molded from an insulative rubber or epoxy material within insulative inner housing 135, power cable elbow connector 105 may include a conductive or semi-conductive insert 140 which surrounds the connection portion of the power cable 145.

A power cable receiving opening 150 may be provided at the opposite end of power cable elbow connector 105 from first and second tee openings 110/120. Power cable receiving opening 150 may be configured to receive power cable 145 therein. A forward end of power cable 145 may be prepared by connecting power cable 145 to a connector lug 155, such as a spade crimp connector, as illustrated in FIG. 1. In one exemplary implementation, connector lug 155 may be crimped onto power cable 145 prior to insertion into power cable receiving opening 150.

First tee end 110 may be configured to receive a deadbreak bushing or other electrical device 112 having a probe or energized electrode positioned within a central opening of first tee end 110. The probe may be connected to power cable 145 via a cable connector engaged with connector lug 155. In some implementations, the probe may be coupled to connector lug 155 via a threaded engagement, e.g., via a threaded stud adapted for coupling to the insert and connector lug 155.

Consistent with implementations described herein, power cable elbow connector 105 may include a voltage detection test point assembly 160 for sensing a voltage in connector 105. As will be described in additional detail below, test point assembly 160 may be configured to output a voltage indication to remote test point assembly 165 via, for example, a remote test point cap 170 and a remote test point cable 175. Remote test point assembly 165 may be configured to receive the voltage indication from remote test point cable 175 make the voltage indication measurable with appropriate voltage sensing devices, such as a volt meter, or the like.

Figure 2:
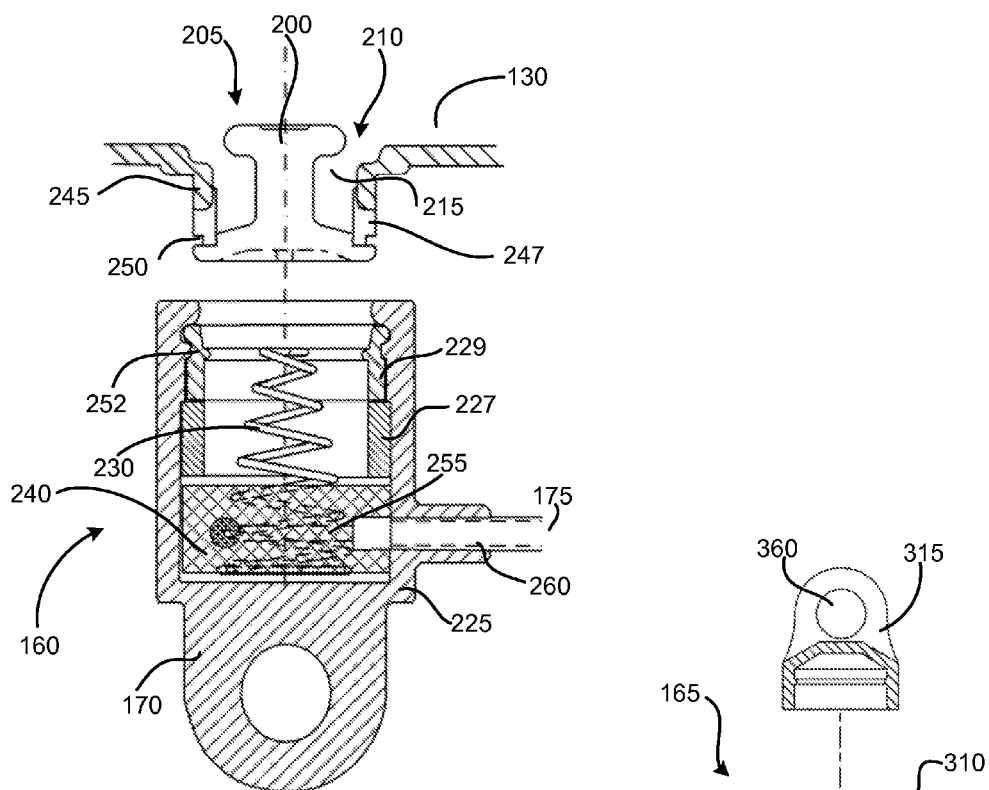
FIG. 2 is an enlarged, cross-sectional view of the test point assembly of FIG. 1.

As illustrated in FIGS. 1 and 2, voltage detection test point assembly 160 may include a test point terminal 200 embedded in a portion 205 of insulative inner housing 135. Portion 205 may extend through an opening 210 within outer shield 130. In one exemplary embodiment, test point terminal 200 may formed of a conductive metal or plastic and may be separated from conductive shield 130 by an insulating portion 215 surrounding test point terminal 200. In some implementations, insulating portion 215 may be co-formed with insulative inner housing 135 during manufacture of connector 105. In this manner, test point terminal 200 may be capacitively coupled to the electrical conductor elements (e.g., power cable 145) within the connector 105.

Consistent with implementations described herein, remote test point cap 170 may sealingly engage portion 205 of insulating inner housing 135 that extends through the conductive shield 130 about the test point terminal 200. As illustrated in FIG. 2, remote test point cap 170 may include an outer housing 225, a contact 230, insulated cable 175, and an epoxy material 240. Remote test point cap 170 may be configured to receive a capacitive voltage from test point terminal 200 and provide the received voltage to insulated cable 175 for transmission to remote test point assembly 165.

Outer housing 225 may be formed of a conductive or semiconductive material similar to that of electrically conductive outer shield 130. As shown in FIG. 2, a sleeve 227 may be provided as a liner inside outer housing 225 for receiving test point 200. Additionally, an insulated insert 229 may be inserted within outer housing 225 for provide an insulated connection mechanism for remote test point cap 170. Insulating insert 229 may be formed of, for example, EPDM. Because outer housing 225 is formed of conductive or semiconductive material connected to ground, insulating insert 229 is provided to insulate test point 200 from the ground connection when remote test point cap 170 is mounted to test point terminal 200. Insulated insert 229 may fixedly engage an inner surface of outer housing 225, e.g., via a friction fit, a ring/groove configuration, etc. Furthermore, insulated insert 229 may include an annular ridge 252 projecting inwardly therefrom.

In one implementation, the opening in outer shield 130 may be formed to project outward from outer shield 130 and may include an outward projection 245 extending perpendicularly from an outer surface of outer shield 130. Test point 200 may be positioned within opening 205 and outward projection 245. In one implementation, an insulating ring 247 may be positioned between test point 200 and outward projection 245. A groove 250 may be formed between outward projection 245 and insulating ring 247 for receiving corresponding ridge 252 in ring 229. The groove/ridge (250/252) relationship may provide for a substantially sealed engagement between outer housing 225 of remote test point cap 170 and outer shield 130 of connector 105.

Contact 230 may be provided in remote test point cap 170, such that connecting remote test point cap 170 to connector 105 results in contact 230 engaging test point terminal 200. As illustrated in FIG. 2, contact 230 may be a conductive material (e.g., a metal) formed as a spring or other resilient structure. Upon placement of remote test point cap 170 over portion 205, contact 230 may come into resilient or compressive contact with test point terminal 200. Engagement between ridge 245 and groove 250 may maintain contact 230 in electrical communication with test point terminal 200. Epoxy material 140 may surround and securely position contact 230 and cable 275 within remote test point cap 170.

Insulated cable 175 may be electrically connected to contact 230. For example, one end of insulated cable 175 may be soldered or otherwise affixed to an end of contact 230 opposite from test point terminal 200. In exemplary embodiments, insulated cable 175 may be configured to adequately receive and transmit a low (e.g., 0.5-1 kilovolts (kV)), medium (e.g., 1 kV-35 kV) or high voltage (e.g., >35 kV). As illustrated in FIG. 2, insulated cable 175 may include a core conductor portion 255 and an outer shielded portion 260.

As described above, insulated cable 175 may be configured to transmit a voltage from test point terminal 200 (e.g., via contact 230) to remote test point assembly 165. For example, a connector such as connector 105 may be mounted in a switchgear assembly. Due to the orientation or positioning of the connector 105, test point assembly 160 may be inaccessible to personnel attempting to monitor voltage in connector 105. In such circumstances, remote test point cap 170 and insulated cable 175 may be attached to test point assembly 160 for transmitting the voltage from test point assembly 160 to remote test point assembly 165 positioned in an accessible manner.

In one implementation consistent with embodiments described herein, remote test point assembly 165 may be configured for mounting on a grounded portion of a panel 180 (FIG. 1) associated with connector 105. For example, panel 180 may include a mounting panel or bracket used to mount connector 105 and other switchgear elements in, e.g., a substation or other power distribution structure.

Although not pictured in FIG. 1, insulating plug 115 may also include a voltage detection test point for monitoring a voltage at insulating plug 115. Consistent with implementations described herein, a test point at insulating plug 115 may be configured for remote testing in a manner similar to that described above with respect to remote test point assembly 165.

Figure 3:
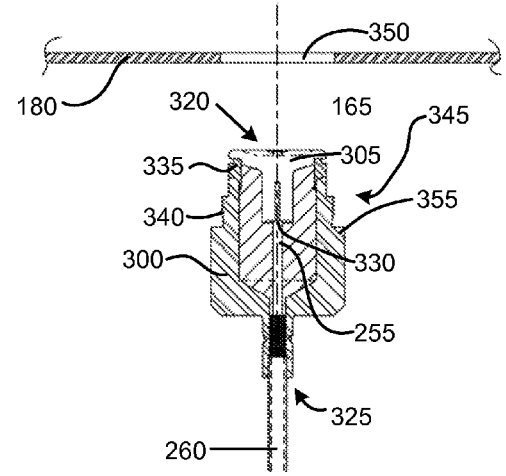
FIG. 3 is an enlarged, cross-sectional view of the remote test point assembly of FIG. 1.

FIG. 3 is an exploded cross-sectional schematic diagram of remote test point assembly 165. As illustrated in FIG. 3, remote test point assembly 165 may include an outer housing 300, a remote test point terminal 305, a lock nut 310, and a test point cap 315.

Outer housing 300 may be configured to receive insulated cable 175 connection with remote test point terminal 305. For example, remote test point terminal 305 may be fixedly mounted at an exposed or open terminal mounting end 320 of outer housing 300. Insulated cable 175 may be receiving through a cable receiving opening 325 in an opposing portion of outer housing 300. Shielded portion 260 of insulated cable 175 may be removed and core conductor portion 255 may be affixed to remote test point terminal 305 within outer housing 300.

In one implementation, during manufacture of remote test point assembly 165, a length of insulated cable 175 may be inserted through cable receiving opening 325. A portion of shielding 260 may be removed and an exposed conductor portion 255 may be inserted into an opening 330 in remote test point terminal 305. Remote test point terminal 305 may be formed of a metal or conductive plastic. Remote test point terminal 305 may be mounted or affixed to outer housing 300 via, for example, an insulated ring 335 in combination with other suitable structures or material (e.g., glue, epoxy, etc.). Similar to insulated insert 229 shown in FIG. 2, insulated ring 335 in remote test point assembly 165 may be formed of, for example EPDM, and may insulate remote test point terminal 305 from contacting grounded outer housing 300 (and mounting panel 180). Insulated cable 175 may be affixed to cable receiving opening 325 in outer housing 300, such as via a crimping region, an epoxy or other adhesive material, etc.

Outer housing 300 may be further configured to include an outer threaded region 340 for facilitating attachment to mounting panel 180. For example, outer housing 300 may be formed to include a substantially cylindrical region 345 (including threaded region 340) configured for insertion through a corresponding opening 350 in panel 180. Outer housing 300 may include a shoulder region 355 spaced from outer threaded region 340 for abutting a surface of panel 180.

During installation, cylindrical region 345 may be inserted through panel opening 350 until shoulder region 355 abuts the surface of panel 180. Lock nut 310, having internal threads corresponding to outer threaded region 340 may be secured to outer threaded region 340 on an opposing side of panel 180 from shoulder region 355. Lock nut 310 may have a hexagonal outer configuration for enabling securing and removal using a conventional wrench. Securing of lock nut 310 to outer housing 300 effectively mounts remote test point assembly 165 to panel 180. In this configuration, remote test point terminal 305 may project from panel 180 in an exposed manner.

Test point cap 315 may sealingly engage a portion of remote test point assembly 165 that extends through panel 180 about remote test point terminal 305 to protect the terminal from environmental conditions. For example, test point cap 315 may include an annular groove configured to matingly engage a corresponding rib or ridge formed in an outer surface of outer housing 300 or ring 335. In one implementation, remote test point cap 315 is formed of a semi-conductive material, such as EPDM. When remote test point terminal 305 is not being read, test point cap 315 may be mounted on remote test point assembly 165. Because test point cap 315 is formed of a conductive or semiconductive material, test point cap 315 may ground the test point when in position. Test point cap 315 may include an aperture 360 for facilitating removal of test point cap 315, e.g., using a hooked lineman's tool.

Figure 4A:
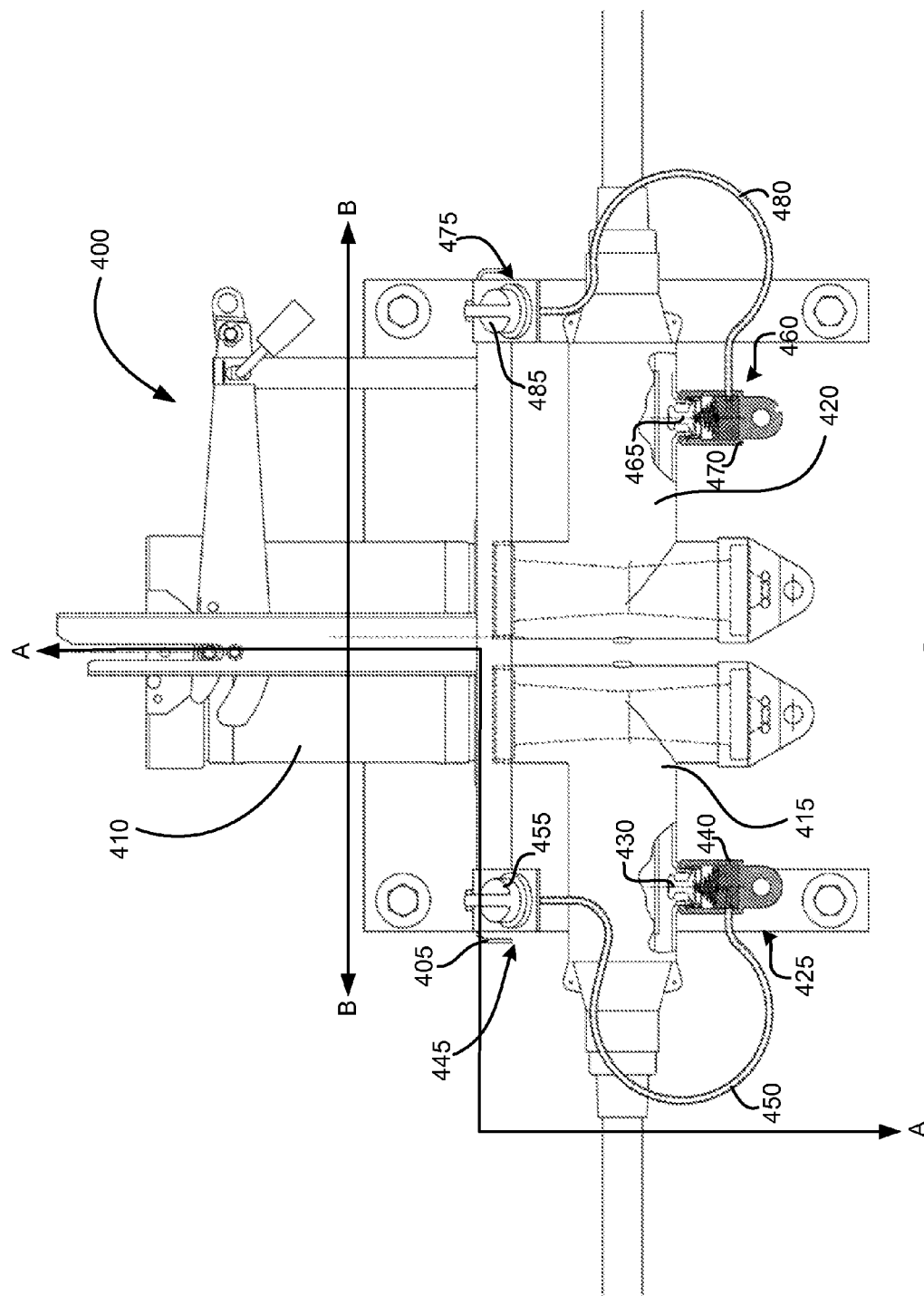
FIGS. 4A-4C depict various views of one exemplary switchgear configuration in which implementations described herein may be used.
Figure 4B:
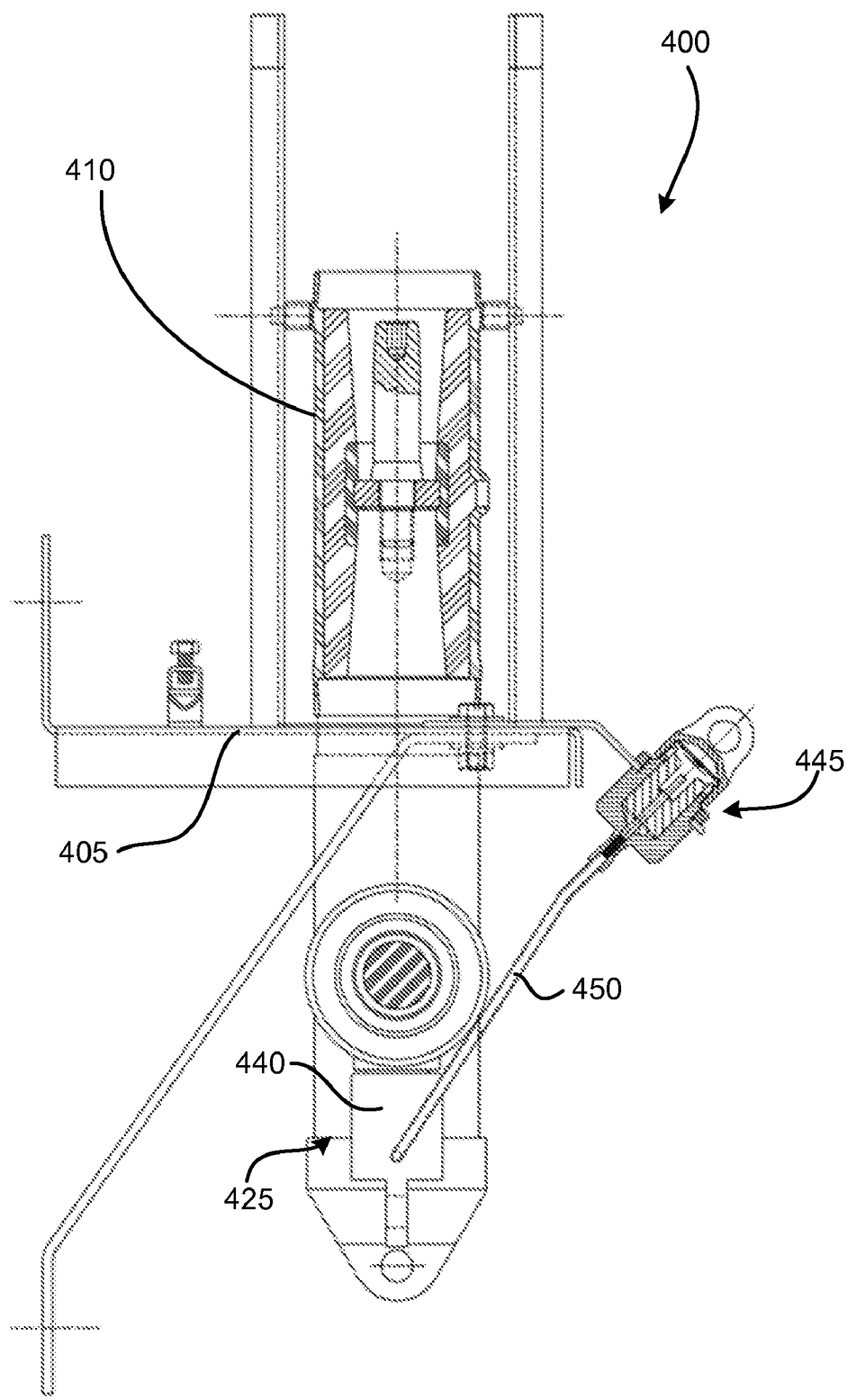
Figure 4C:
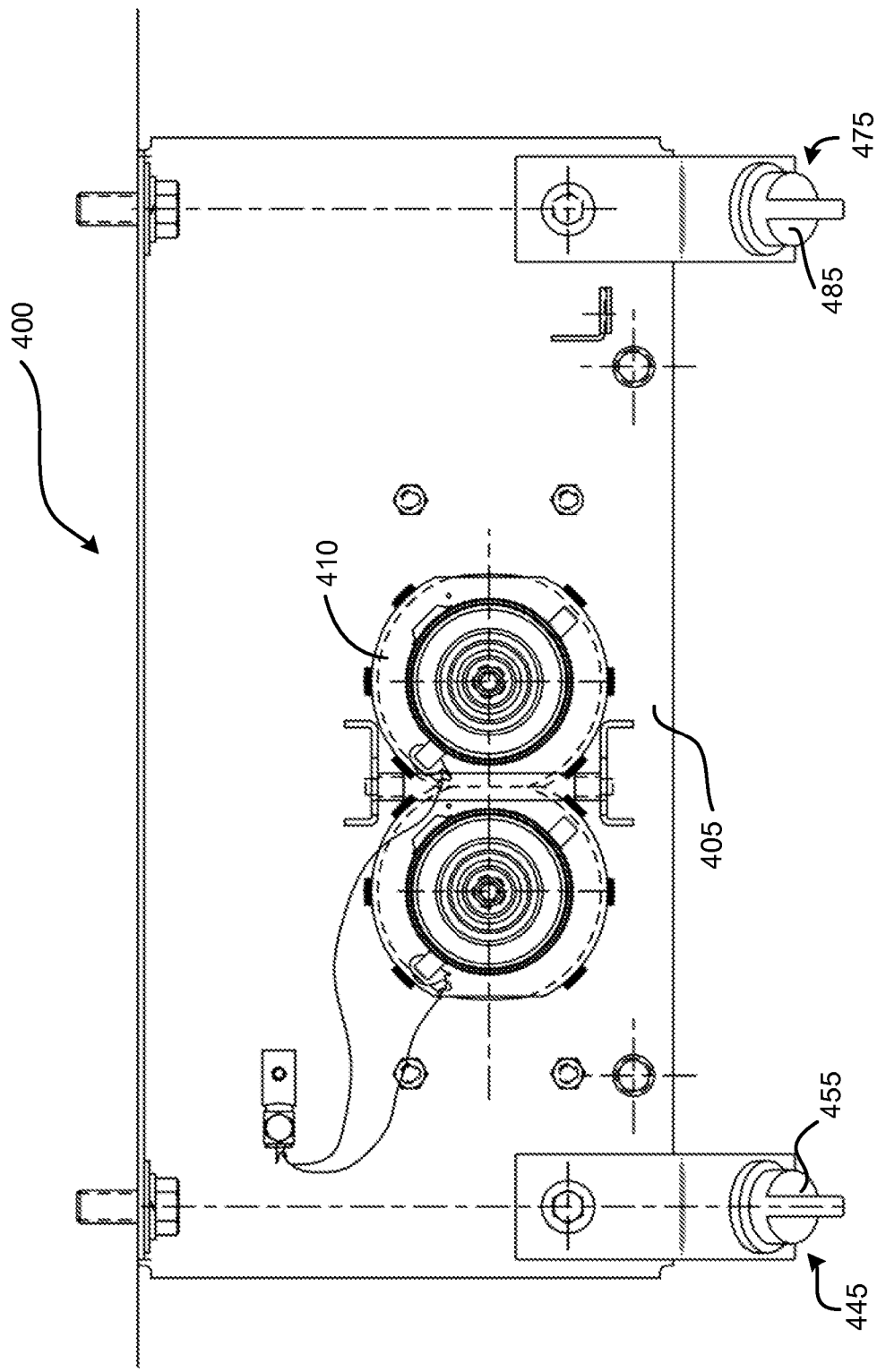

FIGS. 4A-4C depict various views of one exemplary switchgear configuration in which implementations described herein may be used. FIG. 4A illustrates a front view of a switchgear 400. FIG. 4B illustrates a side view of switchgear 400 taken along the line A-A in FIG. 4A. FIG. 4C illustrates a top view of switchgear 400 taken along the line B-B in FIG. 4A.

As illustrated in FIGS. 4A-4B, switchgear 400 may include a mounting panel 405, a cam operated link connector assembly 410, a first elbow connector 415, and a second elbow connector 420. It should be noted that the combination of components depicted in switchgear 400 is for exemplary purposes only, any suitable combination or switchgear components may be used in conjunction with embodiments described herein.

In the manner described above in relation to connector 105, first elbow connector 415 may include a first test point assembly 425 having a first test point terminal 430. A first remote test point cap 440 may be mounted on the first test point assembly 425 and may be connected to a first remote test point assembly 445 via first insulated cable 450.

First remote test point assembly 445 may be mounted on mounting panel 405 in a position easily accessibly by maintenance personnel. First remote test point assembly 445 may include a first test point cap 455.

Second elbow connector 420 may be configured similarly to first elbow connector 415 and may include a second test point assembly 460 having a second test point terminal 465. A second remote test point cap 470 may be mounted on the second test point assembly 460 and may be connected to a second remote test point assembly 475 via second insulated cable 480.

Second remote test point assembly 475 may be mounted on mounting panel 405 in a position easily accessibly by various personnel. Second remote test point assembly 475 may also include a second test point cap 485.

By providing an effective and safe mechanism for monitoring a voltage in an electrical connector from a position remote from the electrical connector, various personnel may be more easily able to safely identify voltage conditions even in configurations in which the connectors or components being monitored are inaccessible. For example, consistent with embodiments described herein, maintenance personnel may be able to safely and easily determine whether a circuit, connector, or electrical component is live/energized without requiring to personnel to have direct access to each test point. Furthermore, in some instances, remote test point assemblies for multiple test points may be grouped together in proximity, thereby enabling additional efficiencies.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments. For example, implementations may also be used for other devices, such as insulating plugs (e.g., 600 Amp insulating plugs, or other plugs) that include capacitive test points.

For example, various features have been mainly described above with respect to elbow power connectors. In other implementations, other medium-high voltage power components may be configured to include the remote test point configuration described above.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A voltage indicating assembly for medium and high voltage systems, comprising:
    a semiconductive cap configured for mounting on a test point, the test point including a test point terminal element configured to capacitively receive a voltage associated with a electrical component, where the electrical component is mounted in a first location,
    wherein the semiconductive cap includes a contact element mounted therein, the contact element configured to electrically communicate with the test point terminal element when the semiconductive cap is mounted on the test point;
    a cable electrically coupled to the contact element; and
    a remote test point assembly electrically coupled to the cable in a second location remote from the first location, wherein the remote test point assembly includes a remote test point terminal element.

2. The voltage indicating assembly of claim 1, wherein the contact element comprises a conductive spring configured to compressingly contact the test point terminal element when the semiconductive cap is mounted on the test point.

3. The voltage indicating assembly of claim 1, further comprising:
an insulated insert provided in the semiconductive cap,
wherein the test point terminal is received in the insulated insert for shielding the test point terminal from ground associated with the semiconductive cap and the electrical component.

4. The voltage indicating assembly of claim 1, wherein the cable comprises an insulated cable configured to transmit medium and high voltages.

5. The voltage indicating assembly of claim 1, wherein the semiconductive cap securely engages the electrical component via a ridge/groove relationship, wherein one of the semiconductive cap or electrical component includes a rib and the other of the semiconductive cap or electrical component includes a corresponding groove for receiving the rib.

6. The voltage indicating assembly of claim 1, wherein the remote test point assembly further comprises:
an outer housing having a terminal element mounting end and a cable receiving opening,
wherein the cable is received in the cable receiving opening and the remote test point terminal element is mounted in the terminal element mounting end;
wherein the outer housing is configured for mounting to a mounting plate at the second location, such that the remote test point terminal element is exposed at the second location.

7. The voltage indicating assembly of claim 6, wherein the mounting plate comprises an opening at the second location for receiving a threaded portion of the outer housing, the remote test point assembly further comprising:
a lock nut having a threaded portion corresponding to the threaded portion of the outer housing,
wherein the lock nut is secured to the threaded portion of the outer housing when the outer housing is received in the opening in the mounting plate to secure the outer housing to the mounting plate.

8. The voltage indicating assembly of claim 6, further comprising:
an insulated ring positioned between the remote test point terminal and the outer housing,
wherein the remote test point terminal is secured in the outer housing via an adhesive material.

9. The voltage indicating assembly of claim 6, further comprising:
a test point cap configured to be removably engaged with outer housing when the outer housing is mounted to the mounting plate.

10. The voltage indicating assembly of claim 9, wherein the test point cap comprises a semiconductive material.

11. The voltage indicating assembly of claim 1, wherein the electrical component comprises a switchgear component.

12. The voltage indicating assembly of claim 1, wherein the electrical component comprises a loadbreak elbow connector, a deadbreak connector, an insulating plug, or a tee connector.

13. A device, comprising:
a remote test point cap configured for mounting on a test point of a medium or high voltage electrical connector, the test point including a test point terminal element configured to capacitively receive a voltage associated with the medium or high voltage electrical connector;
wherein the remote test point cap comprises:
an outer housing configured for secure mounting to the test point; and
a contact element mounted in the outer housing, the contact element electrically coupled to the test point terminal element when the remote test point cap is mounted to the test point;
a cable electrically coupled to the contact element, the cable extending from the outer housing to a remote test point assembly at a second location different from a first location of the electrical connector; and
a remote test point assembly electrically coupled to the cable in the second location,
wherein the remote test point assembly includes a remote test point terminal element for facilitating voltage monitoring by a voltage detecting device.

14. The device of claim 13, wherein the electric connector comprises a deadbreak elbow connector.

15. The device of claim 13, wherein the outer housing comprises a semiconductive material.

16. The device of claim 13, wherein the contact element comprises a conductive resilient element.

17. The device of claim 13, wherein the remote test point assembly is configured for mounting to a mounting plate at the second location.

18. The device of claim 13, wherein the remote test point assembly further comprises a protective cap configured to be removably secured to the remote test point terminal.

19. A system, comprising:
a high voltage electrical component having an insulator surrounding a conductor, an outer conductive shield surrounding the insulator, and a test point terminal embedded in the insulator and extending through an opening in the outer conductive shield,
wherein the test point terminal is configured to capacitively receive a voltage associated with the conductor;
a capacitive remote test point cap configured for mounting adjacent to the opening in the outer conductive shield,
wherein the remote test point cap includes a contact element mounted therein, the contact element configured to electrically communicate with the test point terminal when the remote test point cap is mounted adjacent to the opening in the outer conductive shield;
a cable electrically coupled to the contact element; and
a remote test point assembly electrically coupled to the cable at a second location remote from a location of the high voltage electrical component,
wherein the remote test point assembly includes a remote test point terminal element.

20. The system of claim 19, wherein the location of the high voltage electrical component is inaccessible to personnel and wherein the second location is inaccessible to the personnel.

* * * * *